(12) United States Patent
Schwandner

(10) Patent No.: US 8,376,811 B2
(45) Date of Patent: Feb. 19, 2013

(54) METHOD FOR THE DOUBLE SIDED POLISHING OF A SEMICONDUCTOR WAFER

(75) Inventor: Juergen Schwandner, Garching (DE)

(73) Assignee: Siltronic AG, Munich (DE)

( * ) Notice: Subject to any disclaimer, the term of this patent is extended or adjusted under 35 U.S.C. 154(b) by 439 days.

(21) Appl. No.: 12/771,030

(22) Filed: Apr. 30, 2010

(65) Prior Publication Data

US 2010/0330881 A1 Dec. 30, 2010

(30) Foreign Application Priority Data

Jun. 24, 2009 (DE) .......................... 10 2009 030 292

(51) Int. Cl.
*B24B 1/00* (2006.01)

(52) U.S. Cl. ............... 451/41; 451/57; 451/58; 451/190

(58) Field of Classification Search .................... 451/41, 451/57, 58, 190; 438/689; 216/88
See application file for complete search history.

(56) References Cited

U.S. PATENT DOCUMENTS

| | | | |
|---|---|---|---|
| 3,691,694 A | 9/1972 | Goetz et al. | |
| H0000244 H * | 4/1987 | Goodwin | 451/57 |
| 4,739,589 A | 4/1988 | Brehm et al. | |
| 5,605,487 A * | 2/1997 | Hileman et al. | 451/5 |
| 5,800,725 A * | 9/1998 | Kato et al. | 216/88 |
| 5,821,167 A * | 10/1998 | Fukami et al. | 438/691 |
| 5,989,105 A * | 11/1999 | Kawakawaguchi et al. | 451/44 |
| 6,066,565 A * | 5/2000 | Kuroki et al. | 438/692 |
| 6,299,514 B1 | 10/2001 | Boller | |
| 6,491,836 B1 * | 12/2002 | Kato et al. | 216/88 |
| 6,602,117 B1 | 8/2003 | Chopra et al. | |
| 6,997,782 B2 * | 2/2006 | Nishi et al. | 451/41 |
| 7,507,146 B2 * | 3/2009 | Kato et al. | 451/41 |
| 7,902,039 B2 * | 3/2011 | Tomita et al. | 438/455 |
| 2001/0014570 A1 | 8/2001 | Wenski et al. | |
| 2001/0039101 A1* | 11/2001 | Wenski | 438/471 |
| 2002/0077039 A1 | 6/2002 | Wenski et al. | |
| 2003/0022495 A1* | 1/2003 | Netsu et al. | 438/689 |
| 2005/0227590 A1 | 10/2005 | Sung | |
| 2006/0258268 A1 | 11/2006 | Miyata et al. | |
| 2007/0184658 A1* | 8/2007 | Koyata et al. | 438/689 |
| 2008/0096474 A1* | 4/2008 | Kato et al. | 451/57 |
| 2008/0305722 A1 | 12/2008 | Roettger et al. | |
| 2009/0029552 A1 | 1/2009 | Schwandner et al. | |
| 2009/0057840 A1* | 3/2009 | Netsu et al. | 257/618 |
| 2009/0311863 A1* | 12/2009 | Hashii et al. | 438/691 |
| 2009/0325385 A1* | 12/2009 | Tomita et al. | 438/692 |
| 2010/0136786 A1* | 6/2010 | Ohashi et al. | 438/669 |

FOREIGN PATENT DOCUMENTS

| | | |
|---|---|---|
| DE | 10007390 A1 | 10/2000 |
| DE | 10004578 C1 | 7/2001 |
| DE | 102007035266 A1 | 1/2009 |
| EP | 0208315 B1 | 9/1990 |

(Continued)

*Primary Examiner* — George Nguyen
(74) *Attorney, Agent, or Firm* — Brooks Kusham P.C.

(57) ABSTRACT

Semiconductor wafers are double sided polished by a method of polishing a frontside of the wafer in a first step with a polishing pad with fixed abrasive and simultaneously polishing a backside of the wafer with a polishing pad containing no abrasive, but during which an abrasive polishing agent is introduced between the polishing pad and the backside of the wafer, inverting the wafer, and then in a second step polishing the backside of the wafer with a polishing pad containing fixed abrasive and simultaneously polishing the frontside of the wafer with a polishing pad containing no fixed abrasive, a polishing agent containing abrasive being introduced between the polishing pad and the frontside of the semiconductor wafer.

19 Claims, 1 Drawing Sheet

FOREIGN PATENT DOCUMENTS

| | | |
|---|---|---|
| EP | 1314194 | 5/2003 |
| WO | 9213680 | 8/1992 |
| WO | 9955491 | 11/1999 |
| WO | 0218099 A3 | 3/2002 |

* cited by examiner

METHOD FOR THE DOUBLE SIDED POLISHING OF A SEMICONDUCTOR WAFER

CROSS-REFERENCE TO RELATED APPLICATIONS

This application claims priority to German Patent Application No. DE 10 2009 030 292.1 filed Jun. 24, 2009 which is herein incorporated by reference.

BACKGROUND OF THE INVENTION

1. Field of the Invention

The invention relates to a method for the double sided polishing of a semiconductor wafer. In particular, the invention is intended for double sided polishing of silicon wafers in the next technology generations, primarily wafers which have a diameter of 450 mm.

2. Background Art

At present, polished or epitaxially coated silicon wafers with a diameter of 300 mm are mainly used for the most demanding applications in the electronics industry. Silicon wafers with a substrate diameter of 450 mm are in development.

An essential reason why the electronics industry desires larger substrates for the production of their components, whether microprocessors or memory chips, resides in the enormous economic advantage which they promise. In the semiconductor industry it has for a long time been customary to focus on the available substrate area, or in other words to consider how great a number of components, i.e. logic chips or memory chips, can be accommodated on an individual substrate. This is related to the fact that a multiplicity of the component manufacturer's processing steps are aimed at the entire substrate, but there are also the individual steps for structuring the substrates i.e. producing the component structures which subsequently lead to the individual chips, and therefore the production costs for both groups of processing steps are determined very particularly by the substrate size. The substrate size influences the production costs per component to a very considerable extent, and is therefore of immense economic importance.

However increasing the substrate diameter entails great and sometimes entirely new, hitherto unknown technical problems. Thus, for example, all the processing steps, whether they are purely mechanical (sawing, grinding, lapping), chemical (etching, cleaning) or chemical-mechanical in nature (polishing) as well as the thermal processes (epitaxy, annealing), require thorough revision, in part also with respect to the machines and systems (equipment) used for them.

The present invention focuses on the polishing of a semiconductor wafer as the last essential processing step when the wafer is intended for the production of memory chips, or in principle as the penultimate essential processing step which precedes epitaxy of the wafer, when the wafer is intended to be used as a so-called epi wafer for the production of modern microprocessors.

In the fabrication of semiconductor wafers, it is particularly critical to achieve a sufficiently good edge geometry in the region at a distance of less than or equal to 2 mm from the edge of the wafer, and the nanotopology.

Nanotopology is conventionally expressed as a height variation PV ("peak to valley"), based on square measurement windows with an area of 2 mm×2 mm. The term "nanotopology" or "nanotopography" is defined by SEMI (Semiconductor Equipment and Materials International) as meaning the planarization deviation of the entire wafer frontside in the spatial wavelength range of from 0.2 to 20 mm (lateral correlation length) and within the "fixed quality area" (FQA; a surface region for which the properties stipulated in the product specification must be fulfilled). The nanotopology is measured by fully scanning the entire wafer surface with measurement fields of different size and with overlap. Not one of the surface height variations (peak to valley) found in these measurement fields is allowed to exceed the maximum value required for the entire wafer. The measurement field sizes are defined specification-dependently and, for example, over 2×2 $mm^2$, 5×5 $mm^2$ and 10×10 $mm^2$.

In general, the final nanotopology of a semiconductor wafer is generated by a polishing process. In order to improve the planarity of a semiconductor wafer, equipment and methods for simultaneously polishing the frontside and backside of the semiconductor wafer have been provided and further developed.

So-called double sided polishing (DSP) is described, for example, in U.S. Pat. No. 3,691,694. According to an embodiment of double sided polishing as described in EP 208315B1, semiconductor wafers in metal or plastic "carrier plates" or "templates", which have suitably dimensioned recesses, are moved on a path predetermined by machine and process parameters between two rotating polishing plates covered with a polishing pad in the presence of a polishing sol, and are thereby polished.

The double sided polishing step is conventionally carried out with a polishing pad of homogeneous, porous polymer foam with a hardness of from 60 to 90 (Shore A), as described for example in DE 10004578C1. There, it is disclosed that the polishing pad adhering to the upper polishing plate is permeated by a network of channels and the polishing pad adhering to the lower polishing plate has a smooth surface without such a texture. This measure is intended on the one hand to ensure homogeneous distribution of the polishing agent being used during the polishing, and on the other hand to prevent the semiconductor wafer from sticking to the upper polishing pad when the upper polishing plate is lifted after polishing has been completed.

For double sided polishing, the semiconductor wafer is placed in a recess of a carrier plate so that the backside of the semiconductor wafer rests on the lower polishing plate.

Besides DSP, so-called CMP polishing is also necessary in the prior art in order to eliminate defects and reduce the surface roughness. In CMP, a softer polishing pad is used than in DSP. Furthermore only one side of the semiconductor wafer is polished by means of CMP, namely the side on which components are subsequently intended to be fabricated. The prior art also refers to this as finish polishing. CMP methods are disclosed, for example, in US 2002/0077039 and in US 2008/0305722.

WO 99/55491 A1 describes a two-stage polishing method with a first FAP ("fixed-abrasive polishing") polishing step using a polishing pad with abrasive fixed in it, and a subsequent second CMP ("chemical-mechanical polishing") polishing step. In CMP (as in DSP), in contrast to FAP polishing, the polishing pad contains no fixed abrasive substance. Here, as in a DSP step, abrasive substances in the form of a suspension are introduced between the silicon wafer and the polishing pad. Such a two-stage polishing method is used in particular to eliminate scratches which the FAP step has left behind on the polished surface of the substrate.

German Patent Application DE 102 007 035 266 A1 describes a method for polishing a substrate of silicon material, comprising two polishing steps of the FAP type which differ in that a polishing agent suspension which contains unbound abrasive substance as a solid is introduced between the substrate and the polishing pad in one polishing step, while in the second polishing step the polishing agent suspension is replaced by a polishing agent solution which is free of solids.

It has been found that the methods of double sided polishing followed by a finishing CMP polish, which are known in the prior art, will not meet future requirements for edge geometry and nanotopology and are unsuitable for processing wafers with substrate diameters of 450 mm. It would be highly desirable to provide such a method.

SUMMARY OF THE INVENTION

The invention is directed to a method for the double sided polishing of a semiconductor wafer, comprising polishing a frontside of the semiconductor wafer in a first step by using a polishing pad with fixed abrasive, and simultaneously polishing a backside of the semiconductor wafer with a polishing pad that contains no abrasive, but during which a polishing agent containing abrasive is introduced between the polishing pad and the backside of the semiconductor wafer, subsequent inversion of the semiconductor wafer, and then in a second step polishing the backside of the semiconductor wafer with a polishing pad that contains fixed abrasive and simultaneously polishing the frontside of the semiconductor wafer with a polishing pad that contains no fixed abrasive, a polishing agent containing abrasive being introduced between the polishing pad and the frontside of the semiconductor wafer.

DETAILED DESCRIPTION OF THE PREFERRED EMBODIMENT(S)

Figure 1:
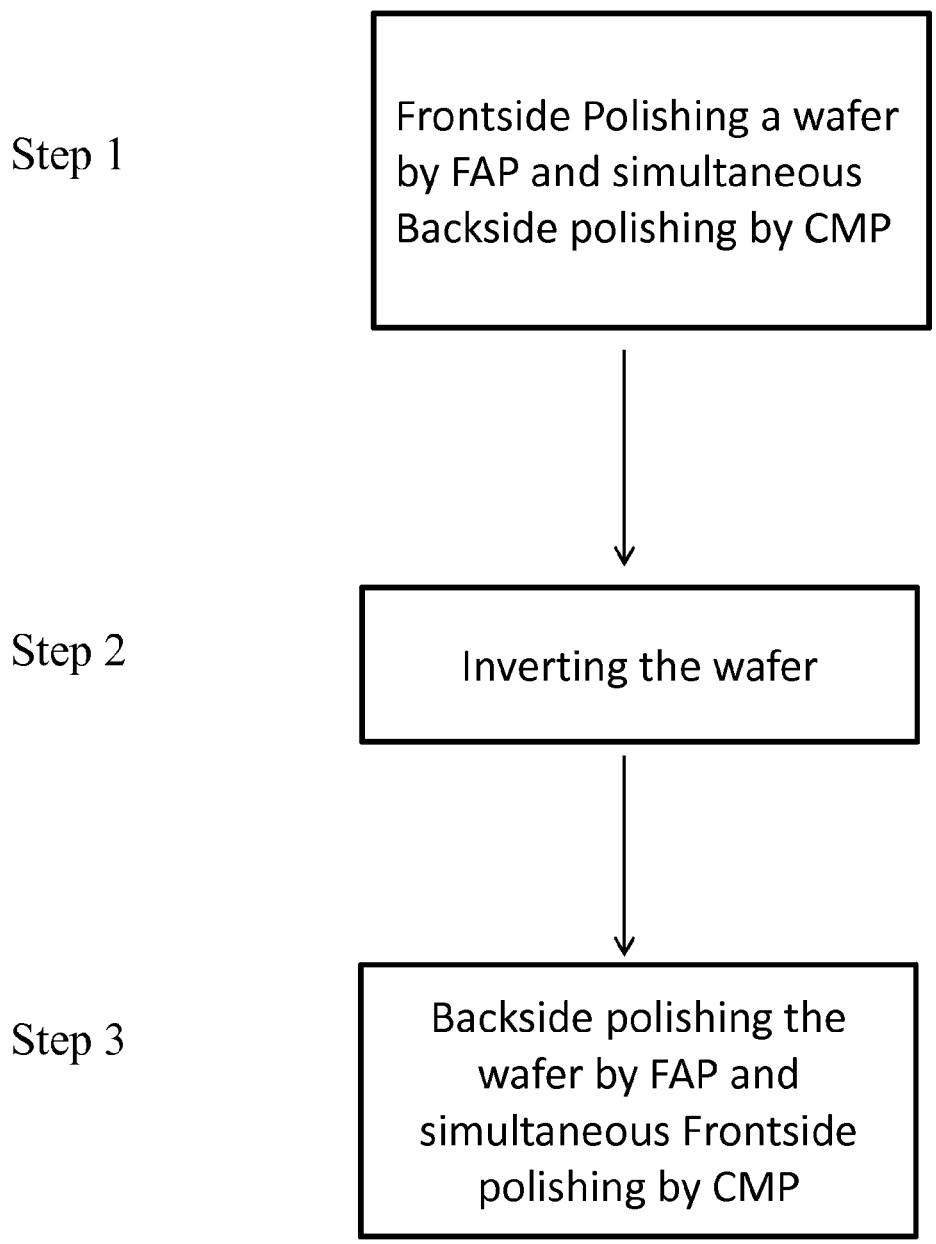
FIG. 1 illustrates one embodiment of the process of the invention.

The invention thus provides a combined simultaneous double sided polishing process, in that FAP polishing and CMP polishing take place simultaneously first on the frontside/backside and then on the backside/frontside. The new method can obviate the conventional DSP step and the subsequent separate CMP step.

The invention can be carried out on existing equipment for the double sided polishing of semiconductor wafers, for example on a commercially available double sided polishing machine of the AC2000 type from Peter Wolters, Rendsburg (Germany). This polishing machine is equipped with pin interlocking of the outer and inner wheels in order to drive the carrier plates. The equipment may be configured for one or more carrier plates. Equipment with a plurality of carrier plates is preferred for higher throughput, such as the one described for example in DE-100 07 390 A1 in which the carrier plates move on a planetary path about the center of the equipment. The equipment comprises a lower polishing plate and an upper polishing plate, which are freely rotatable horizontally and are covered with a polishing pad. During polishing, the semiconductor wafers lie in the recesses of the carrier plates and between the two polishing plates, which rotate and exert a particular polishing pressure on them while a polishing agent is continuously supplied. The carrier plates are also set in motion, preferably via rotating pin rings which engage in teeth on the circumference of the carrier plates.

A typical carrier plate comprises recesses to hold three semiconductor wafers. On the circumference of the recesses, there are inlays which are intended to protect the fragile edges of the semiconductor wafers, including in particular from metals being released from the carrier plate body. The carrier plate body may for example consist of metal, ceramic, plastic, fiber-reinforced plastic, or metal which is coated with "diamond-like carbon" (DLC layer). Steels are however preferred, stainless chrome steel being particularly preferred. The recesses are preferably configured to hold an odd number of semiconductor wafers with a diameter of at least 200 mm, preferably 300 mm, more preferably 450 mm with thicknesses of from 500 to 1000 µm.

The polishing agent contains abrasive. The size distribution of the abrasive substance particles is preferably monomodal, and the average particle size is from 5 to 300 nm, more preferably from 5 to 50 nm. The abrasive substance consists of a material which mechanically removes the substrate material, preferably one or more of the oxides of the elements aluminum, cerium or silicon.

The proportion of the abrasive substance in the polishing agent suspension is preferably from 0.25 to 20 wt. %, more preferably from 0.25 to 1 wt. %. It is particularly preferable to use colloidally dispersed silica as the polishing agent suspension. For example, the aqueous polishing agents Levasil® 200 from Bayer AG and Glanzox 3900® from Fujimi may be employed.

The polishing agent preferably contains additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), or mixtures thereof.

The polishing agent suspension may, however, also contain one or more further additives, for example surface-active additives such as wetting agents and surfactants, stabilizers acting as protective colloids, preservatives, biocides, alcohols and sequestrants.

In a method according to the invention, a polishing pad is used which contains abrasive substance bound in the polishing pad (FAP or FA pad). Suitable abrasive substances comprise, for example, particles of oxides of the elements cerium, aluminum, silicon or zirconium and particles of hard substances such as silicon carbide, boron nitride and diamond.

Particularly suitable polishing pads have a surface topography imparted by replicated microstructures. These microstructures ("posts") have, for example, the shape of columns with a cylindrical or polygonal cross section or the shape of pyramids or pyramid frustums. More detailed descriptions of such polishing pads are contained, for example, in WO 92/13680 A1 and US 2005/227590 A1. It is most preferred to use a polishing pad with cerium oxide abrasive fixed in it, as described for example in U.S. Pat. No. 6,602,117 B1.

The grain sizes of the FAP polishing pads used (size of the fixed abrasive/particles) are preferably greater than or equal to 0.1 µm and less than or equal to 1.0 µm. A particle size of 0.1-0.6 µm is particularly preferred, while a particle size of 0.1-0.25 µm is more preferred.

One polishing plate is equipped with such an FAP pad as described above. The second polishing plate carries a conventional CMP polishing pad. The CMP polishing pads used are polishing pads with a porous matrix.

The polishing pad preferably consists of a thermoplastic or thermosetting polymer. A multiplicity of substances may be envisaged for the material, for example polyurethane, polycarbonate, polyamide, polyacrylate, polyester etc. The polishing pad preferably contains solid, microporous polyurethane. It is also preferable to use polishing pads made of foamed plates or felt or fiber substrates, which are impregnated with polymers. Coated/impregnated polishing pads may also be configured so that there are a different pore distribution and different pore sizes in the substrate than in the coating.

The polishing pads may be substantially flat, or perforated, and in order to control the porosity of the polishing pad, fillers may be introduced into the polishing pad. Commercially available polishing pads are, for example, the SPM 3100 from Rodel Inc. or the pads of the DCP series and the pads of the IC 1000™, Polytex™ or SUBA™ brands from Rohm & Hass.

The semiconductor wafer is preferably a wafer of silicon, silicon-germanium, silicon dioxide, silicon nitride or gallium arsenide or other so-called III-V semiconductors. The use of silicon in monocrystalline form is preferred, for example crystallized by a Czochralski or floating zone process. Silicon with a (100), (110) or (111) crystal orientation is particularly preferred.

The starting material for the inventive method is a multiplicity of semiconductor wafers which, in a conventional manner, have been cut from a crystal, have had their edges rounded, and optionally have been subjected to further process steps. The semiconductor wafers may have a lapped, ground, etched, polished, epitaxially coated or otherwise coated surface.

As mentioned above, when carrying out polishing according to the invention on a double sided polishing machine, for example of the AC2000 type from Peter Wolters/Rendsburg, the single sided finish polishing (CMP) which is obligatory in the prior art can be dispensed with, since both the polishing which determines the geometry and that which determines the surface quality are carried out fully on one type of machine.

In the prior art, stock and finish polishing (DSP and CMP) have been carried out separately from one another and on different polishing machines. Only the frontside of the semiconductor wafer has been polished by means of CMP in the prior art.

In order to achieve an optimal wafer geometry, here above all, the edge geometry (edge roll-off elimination), simultaneous double sided polishing with planetary kinematics and the combined used of fixed-abrasive and CMP polishing pads offer advantages since the fixed-abrasive polishing process makes it possible to dispense with a component containing silica sol in order to obtain the necessary polishing removal, owing to the hard pad optionally configurable with an overhang, and it also allows the edge region of the semiconductor wafer to be deliberately influenced.

Furthermore, the CMP polishing may readily be integrated in the scope of simultaneous double sided polishing by one of the polishing plates being equipped with a CMP polishing pad, on which the CMP step takes place.

The double sided polishing according to the invention takes place in two polishing substeps, between which the wafer is turned over. The fact that the entire polishing process is carried out on one type of polishing machine leads to a considerable simplification of the entire process sequence and to a saving on space requirements.

Edge polishing may be carried out before the double sided polishing according to the invention, between the two polishing substeps of the double sided polishing or even after the complete double sided polishing.

For this, the edge of a centrally rotating silicon wafer is pressed with a particular force (application pressure) against a centrally rotating polishing drum. Such an edge polishing method is known from U.S. Pat. No. 5,989,105, in which the polishing drum consists of an aluminum alloy and carries a polishing pad. The silicon wafer is conventionally fixed on a flat wafer holder, a so-called chuck. The edge of the silicon wafer protrudes from the chuck, so that it is freely accessible to the polishing drum.

These conventional edge polishing methods detrimentally affect in particular the local geometry in the edge region of the semiconductor wafer. This is related to the fact that with the relatively "soft edge polishing pads" used (it is conventional to use relatively soft polishing pads on which silica sol is applied), not only is the edge itself polished, but also an outer part on the frontside and/or backside of the semiconductor wafer, which may be explained by the hard silicon edge being "immersed" into the polishing pad on which a polishing agent suspension is applied. The effect of this is specifically that material is removed not only in the region of the edge per se but also in the adjacent region on the frontside and/or backside.

Preferably, the edge polishing of the semiconductor wafer in the method according to the invention is carried out by fixing the semiconductor wafer on a centrally rotating chuck, bringing together the semiconductor wafer and a centrally rotating polishing drum which is inclined relative to the chuck and carries a polishing pad containing fixed abrasive, and pressing together the semiconductor wafer and the polishing drum while continuously supplying a polishing agent solution, which contains no solids.

The polishing agent solution is preferably water or an aqueous solution of the compounds sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), or any mixtures thereof. The proportion of these compounds in the polishing agent solution is preferably from 0.01 to 10 wt. %, and the pH of the polishing agent solution is preferably from 10 to 12.

The polishing pad which is used for the edge polishing and which is fastened on the polishing drum, preferably contains abrasive substances selected from particles of oxides of the elements cerium, aluminum, silicon or zirconium, or particles of hard substances such a silicon carbide, boron nitride or diamond. It is most preferable to use a polishing pad with cerium oxide abrasive fixed in it, as described for example in U.S. Pat No. 6,602,117 B1. The average particle size of the abrasive is preferably 0.1-1 µm, particularly preferably 0.1-0.6 µm and more preferably 0.1-0.25 µm.

Two-stage edge polishing is preferably carried out, a first edge polish taking place between the two substeps of the double sided polishing and the second edge polish taking place after the end of the entire double sided polishing, which allows the edge polishing to be tuned more finely by being split and therefore makes it possible to affect the wafer edge geometry as little as possible, especially as it is known that the edge polishing usually degrades the geometry in the local edge region of the semiconductor wafer.

Preferably, the second edge polish is carried out while supplying a polishing agent suspension containing abrasive. The proportion of the abrasive substances in the polishing agent suspension is preferably from 0.25 to 20 wt. %. The abrasive substances in the polishing agent suspension are preferably selected from one or more of the groups consisting of oxides of the elements aluminum, cerium or silicon. Preferably, the polishing agent suspension is colloidally dispersed silica, and the pH of the polishing agent suspension is preferably from 9 to 11.5, and is preferably adjusted by introducing additives selected from the group consisting of sodium carbonate ($Na_2CO_3$), potassium carbonate ($K_2CO_3$), sodium hydroxide (NaOH), potassium hydroxide (KOH), ammonium hydroxide (NH$_4$OH), tetramethylammonium hydroxide (TMAH), or any mixtures of these compounds.

The invention makes it possible to deliberately influence the outer edge region and to improve the local geometry in the marginal region (less than or equal to 2 mm EE, in particular less than or equal to 1 mm).

The method furthermore leads to a simplified process sequence. The entire polishing process is shortened by the stock polishing and finish polishing processes taking place on one polishing machine. The CMP polishing process provided in the prior art is obviated, which offers cost advantages.

The process may be illustrated by the flow chart of FIG. 1. The wafer frontside is polished by the use of FAP (fixed abrasive pad) while the front surface is simultaneously polished by CMP. In Step 2, the wafer is inverted, and in Step 3, the wafer backside is polished using FAP while the wafer frontside is polished using CMP.

EXAMPLE

Conduct of a split free-floating double sided polishing process, which produces the majority of the required setpoint material removal from a silicon wafer in a first step and carries out the finish polishing of the silicon wafer in a second step.

First, the frontside is polished on the upper FAP polishing pad.

Simultaneously, the backside is polished by the CMP polishing pad.

Inversion of the wafer takes place between the first and second steps.

In the second step, the frontside is finish-polished on the lower CMP polishing pad while the backside is simultaneously finish-polished on the upper FAP polishing pad. Both steps take place on the same double sided polishing machine with planetary kinematics. The result is a finish-polished wafer with an optimal edge geometry, improved nanotopological properties and with a variable backside roughness.

The upper polishing plate is covered with a fixed-abrasive polishing pad, and the lower polishing plate is covered with a typical finish polishing pad. The FAP polishing pad may be tailored to control the wafer edge geometry at its edge, so that a wafer overhang is obtained. The edge roll-off can thereby be reduced considerably. An improved local geometry is obtained at the edge of the wafer.

Step 1:

Polishing the wafer frontside by means of FAP polishing and simultaneously polishing the wafer backside by means of CMP polishing.

The first substep begins with the polishing process being started at the beginning of the polishing with polishing slurry based on colloidal silica sol (for example Levasil® 200 from Bayer AG) and alkaline polishing solution (for example K$_2$CO$_3$+KOH) in the conventional way, i.e. similarly to the conventional polishing process of DSP polishing, in order to initiate a stock polishing process on the CMP polishing pad. As the CMP polishing pad ("finishing pad"), it is preferable to use the SPM 3100 from Rodel Inc.

After the polishing process has been started, the externally supplied silica sol is turned off so that the two polishing pads now only receive alkaline polishing solution.

In order to optimally configure the material removal on the soft CMP pad after turning off the external silica sol, in particular potassium silicate (K$_2$SiO$_3$) may also be used besides the preferable potassium carbonate (K$_2$CO$_3$) and KOH. Carbonate, hydroxide, and silicate compounds, the cations of which come from the 1st main group of the periodic table (for example sodium, lithium), may also be envisaged besides ammonium.

For example, potassium silicate is the potassium salt of silica. The pH of K$_2$SiO$_3$ is comparable with the pH of K$_2$CO$_3$ for similar concentrations of alkali (pH range: 11-12.5). By means of adding little potassium silicate, once it has been "started" (with silica sol), it is possible to maintain a chemical-mechanical stock polishing process without external supply of colloidal SiO$_2$.

After a particular target material removal is reached, which corresponds to the majority (>50%) of the setpoint material removal, the polishing run is in turn stopped with a silica sol, Glanzox 3900 for example being used here since it has better smoothing properties than other silica sols. Glanzox 3900 is the product name of a polishing agent suspension which is provided as a concentrate by Fujimi Incorporated, Japan. The undiluted solution has a pH of 10.5 and contains about 9 wt. % of colloidal SiO$_2$ with an average particle size of from 30 to 40 nm. This results in a hydrophilic surface of the semiconductor wafer, on which no uncontrolled etching takes place so that a smooth surface is achieved.

Intermediate step: "Wafer flipping"

Turning over the wafer, inverting the semiconductor wafer

Step 2:

Polishing the backside by means of FAP polishing and simultaneously polishing the frontside by means of CMP polishing (finish polishing) in order to reduce the defect rate, the FAP-induced microdamage (FAP) and to adjust the surface roughness of the frontside.

The duration of this second substep should be selected so that on the one hand the desired result is achieved on the frontside (i.e. a finish-polished surface) and on the other hand an accurately defined backside roughness is obtained. Here, primarily the silica sol Glanzox 3900 is used as an abrasive component.

In order to achieve the desired backside roughness during the FAP polishing of the backside, the following procedure is preferably adopted:

Over the plane surface of its backside, the semiconductor wafer preferably has an average surface roughness R$_a$ in a wide range of from 0.3 to 4.5 nm, expressed in terms of spatial wavelengths less than or equal to 250 μm. Suitable for determining the surface roughness is a Chapman Surface Profiler MP 2000 with a 250 μm filter (spatial wavelengths longer than 250 μm=waviness data, cf. Chapman Technical Note-TG-1, Rev-01-09).

If a high backside roughness in the aforementioned range is desired, then FAP pads with grain sizes of 0.5-1.0 μm will preferably be used. If a low backside roughness is desired, then FAP pads with grain sizes of 0.1-0.25 μm will preferably be used.

In order to achieve the desired surface roughness on the backside, it may be advantageous to carry out additional single sided polishes of the backside. This will preferably be done in three steps, each using a polishing pad which contains an abrasive substance bound in the polishing pad and is pressed with a polishing pressure onto the backside of the silicon wafer, a polishing agent which is free of solids being introduced between the polishing pad and the backside of the silicon wafer in the first step, while a polishing agent which contains abrasive substances is introduced in the second and third steps, a polishing pressure of 8-15 psi in the first and second steps being reduced to 0.5-5 psi in the third step.

The polishing agent solution in the first step of polishing the backside of the silicon wafer in the method according to the invention is in the simplest case water, preferably deionized water (DIW), with the purity required for use in the silicon industry. The polishing agent solution may however also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures thereof. It is most preferred to use potassium carbonate.

In the second step of polishing the backside of the silicon wafer, a polishing agent containing abrasive is used. The abrasive substance consists of a material which mechanically removes the substrate material, preferably one or more of the oxides of the elements aluminum, cerium or silicon. A polishing agent suspension which contains colloidally dispersed silica is particularly preferred.

In the third step of polishing the backside of the silicon wafer, a polishing agent containing abrasive is used likewise as in the second step. Compared with the first and second steps, the polishing pressure is reduced from 8-15 psi to 0.5-5 psi.

Conventional polishing machines are suitable for carrying out these polishes, for example the polishing machine "nHance 6EG" from Strasbaugh Inc.

The polishing machine from Strasbaugh Inc. has a polishing plate with a polishing pad and a polishing head, which processes a semiconductor wafer fully automatically. The polishing head is universally mounted and comprises a fixed base plate which is covered with a "backing pad", and a mobile retainer ring. Air cushions, on which the semiconductor wafer floats during the polishing, can be set up through holes in the base plate in two concentric pressure zones: an inner pressure zone and an outer pressure zone. The mobile retainer ring can be pressurized by means of a compressed air bladder so as to prestress the polishing pad upon contact with the semiconductor wafer, and keep it flat.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for the double sided polishing of a semiconductor wafer, comprising polishing the frontside of the semiconductor wafer in a first step by using a polishing pad with fixed abrasive and simultaneously polishing the backside of the semiconductor wafer with a polishing pad that contains no abrasive, but during polishing of the backside, a polishing agent containing abrasive is introduced between the polishing pad and the backside of the semiconductor wafer, inverting the semiconductor wafer, and then in a second step, polishing the backside of the semiconductor wafer with a polishing pad that contains fixed abrasive and simultaneously polishing the frontside of the semiconductor wafer with a polishing pad that contains no fixed abrasive, a polishing agent containing abrasive being introduced between the polishing pad and the frontside of the semiconductor wafer.

2. The method of claim 1, wherein the polishing agent contains one or more abrasives of oxides of the elements aluminum, cerium, or silicon.

3. The method of claim 1, wherein the polishing agent is colloidal silica.

4. The method of claim 2, wherein the polishing agent comprises one or more compounds selected from the group consisting of sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH).

5. The method of claim 1, wherein the polishing pad with fixed abrasive comprises one or more particles selected from the group consisting of oxides of the elements cerium, aluminum, silicon and zirconium, and/or particles selected from the group consisting of hard substances silicon carbide, boron nitride and diamond.

6. The method of claim 5, wherein the polishing pad contains cerium oxide particles.

7. The method of claim 1, wherein the polishing pad with fixed abrasive contains particles with a size of greater than or equal to 0.1 µm and less than or equal to 1.0 µm.

8. The method of claim 1, wherein the polishing pad which contains no fixed abrasive has a porous matrix.

9. The method of claim 1, wherein the polishing pad which contains no fixed abrasive consists of a thermoplastic or thermosetting polymer.

10. The method of claim 9, wherein the polishing pad comprises solid, microporous polyurethane.

11. The method of claim 1, wherein the semiconductor wafer comprises silicon, silicon-germanium, silicon dioxide, silicon nitride or a III-V semiconductor.

12. The method of claim 1, wherein at least one edge polish of the semiconductor wafer takes place before the first double sided polishing or after the second double sided polishing, or between the two double sided polishing steps.

13. The method of claim 12, wherein two edge polishes are carried out, a first edge polish between the two double sided polishing steps and a second edge polish after the second double sided polishing.

14. The method of claim 13, wherein the two edge polishes are respectively carried out by fixing the semiconductor wafer on a centrally rotating chuck, bringing together the semiconductor wafer and a centrally rotating polishing drum which is inclined relative to the chuck and carries a polishing pad containing fixed abrasive, and pressing together the semiconductor wafer and the polishing drum while continuously supplying a polishing agent.

15. The method of claim 14, wherein a polishing agent which contains no solids is used during the first edge polish.

16. The method of claim 14, wherein the second edge polish is carried out while supplying a polishing agent suspension containing abrasive.

17. The method of claim 15, wherein the second edge polish is carried out while supplying a polishing agent suspension containing abrasive.

18. The method of claim 14, wherein the polishing pad fastened on the polishing drum contains one or more abrasive substances of particles of oxides of the elements cerium, aluminum, silicon and zirconium or particles of hard substances silicon carbide, boron nitride and diamond.

19. The method as claimed in claim 18, wherein an average particle size of the abrasive is 0.1-1 µm.

* * * * *